(12) United States Patent
Jadhav et al.

(10) Patent No.: US 7,534,715 B2
(45) Date of Patent: May 19, 2009

(54) METHODS INCLUDING FLUXLESS CHIP ATTACH PROCESSES

(75) Inventors: Susheel Jadhav, Chandler, AZ (US); Daoqiang Lu, Chandler, AZ (US); Nitin Deshpande, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 105 days.

(21) Appl. No.: 11/323,526

(22) Filed: Dec. 29, 2005

(65) Prior Publication Data

US 2007/0152328 A1 Jul. 5, 2007

(51) Int. Cl.
*H01L 21/44* (2006.01)
*H01L 21/48* (2006.01)

(52) U.S. Cl. .................. 438/612; 438/613; 438/615; 438/108; 257/772; 257/737; 257/E21.508

(58) Field of Classification Search ............. 438/612, 438/613, 615, 108; 257/E21.508, 772
See application file for complete search history.

(56) References Cited

U.S. PATENT DOCUMENTS

| | | | |
|---|---|---|---|
| 4,716,049 A * | 12/1987 | Patraw | 216/18 |
| 5,953,623 A * | 9/1999 | Boyko et al. | 438/612 |
| 6,121,069 A * | 9/2000 | Boyko et al. | 438/106 |
| 6,163,463 A * | 12/2000 | Marrs | 361/773 |
| 6,504,242 B1 | 1/2003 | Deppisch et al. | 257/707 |
| 6,767,819 B2 * | 7/2004 | Lutz | 438/614 |
| 6,833,289 B2 | 12/2004 | Hu et al. | 438/121 |
| 6,955,982 B2 * | 10/2005 | Jimarez et al. | 438/616 |
| 7,009,289 B2 | 3/2006 | Hu et al. | 257/706 |
| 7,053,494 B2 * | 5/2006 | Seko | 257/784 |
| 7,078,820 B2 | 7/2006 | Yanagida | 257/779 |
| 7,122,460 B2 * | 10/2006 | Hua | 438/614 |
| 7,220,622 B2 | 5/2007 | Jadhav et al. | 438/122 |
| 2001/0036692 A1 * | 11/2001 | Yamazaki et al. | 438/166 |
| 2003/0119299 A1 * | 6/2003 | Jiang et al. | 438/612 |
| 2004/0253803 A1 * | 12/2004 | Tomono et al. | 438/614 |
| 2006/0060637 A1 | 3/2006 | Susheel et al. | 228/207 |
| 2007/0080451 A1 | 4/2007 | Suh | 257/737 |

\* cited by examiner

*Primary Examiner*—Nitin Parekh
(74) *Attorney, Agent, or Firm*—Konrad Raynes & Victor, LLP

(57) ABSTRACT

Electronic devices and methods for fabricating electronic devices are described. One method includes providing a plurality of first metal bumps on a first surface, and a plurality of second metal bumps on a second surface, wherein at least one of (i) the plurality of first metal bumps, and (ii) the plurality of second metal bumps, comprises a solder. The method also includes forming a metal region including indium and tin, on at least one of (i) the plurality of first metal bumps, and (ii) the plurality of second metal bumps. The method also includes positioning the first metal bumps on the second metal bumps, and heating the metal bumps and the metal region and melting the solder. Other embodiments are described and claimed.

25 Claims, 4 Drawing Sheets

METHODS INCLUDING FLUXLESS CHIP ATTACH PROCESSES

RELATED ART

Integrated circuits may be formed on semiconductor wafers made of materials such as silicon. The semiconductor wafers are processed to form various electronic devices thereon. The wafers are diced into semiconductor chips, which may then be attached to a package substrate using a variety of known methods. For instance, bonding pads on the chip may be electrically connected to bonding pads on the package substrate using wire bonding. Alternatively, a flip-chip bonding method may be used.

One flip chip bonding method is known as the C4 method or the controlled collapse chip connection method. In the C4 method, solder bumps may be placed on pads on the active side of the chip, on the substrate, or on both the chip and substrate. The solder bumps are then melted and permitted to flow, to ensure that each bump fully wets the pad it was formed on. A flux is then typically applied to at least one of the surfaces to be joined and the surfaces on the chip and substrate are brought into contact. The flux acts to isolate the solder from the atmosphere and provides an adhesive force which acts to hold the chip and substrate together. A second reflow operation is then carried out by heating the chip and substrate to a temperature greater than the melting point of the solder, and a solder connection is made between the die pads and the substrate pads. The joined package is then cooled and the solder solidified. Excess flux or flux residue remaining may be removed in a defluxing operation, which may include chemical rinsing and heating operations. An material such as a polymer is then typically applied between the chip and substrate as an underfill encapsulant.

BRIEF DESCRIPTION OF THE DRAWINGS

Embodiments are described by way of example, with reference to the accompanying drawings, which are not drawn to scale, wherein.

DETAILED DESCRIPTION

The use of flux in a chip attach process such as the C4 process described above can lead to certain problems. Flux residue can cause voids to form in the solder joints, and thus lower the electrical performance. The flux reside also leads to decreased package reliability. Furthermore, the application of the flux and the subsequent defluxing operations add time and complexity to the processing procedure. In addition, conventional defluxing operations do not remove all of the organic flux residue present in the joint.

Certain embodiments relate to the formation of electronic assemblies, including fluxless attach processes for forming electronic connections between components. Such processes may be incorporated into a C4 processing operation.

Figure 1:
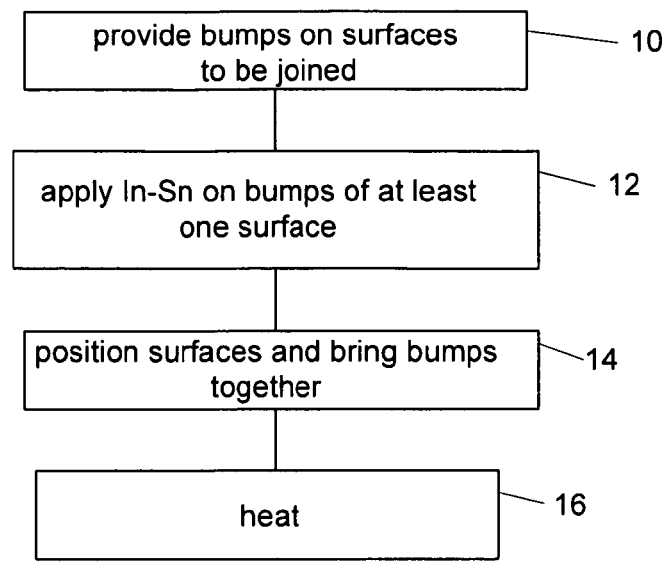
FIG. 1 is a flow chart of certain operations in accordance with certain embodiments.

FIG. 1 is a flow chart showing a number of operations in accordance with certain embodiments for a fluxless bonding process. Box 10 is providing bumps on surfaces to be joined. For example, in certain embodiments, a semiconductor chip (also known as a die) may include an active surface having a plurality of metal pads electrically connected to devices formed in active regions of the chip. A bump may be formed on the metal pad for attachment to another surface. A substrate to which the chip is to be attached may also include a surface having a plurality of metal pads and bumps thereon. The bumps may be formed from a variety of metals, including, but not limited to, solders.

Box 12 is applying indium and tin on the bumps of at least one of the surfaces to be joined. In certain embodiments indium (In) and tin (Sn) is formed on the bumps of both surfaces, or indium and tin on the bumps of one surface and either gold (Au) or gold and nickel (Ni) on the other group of bumps. In certain embodiments, the bumps, may have a width and height of up to about 100 microns (µm), and in certain embodiments the indium and tin region may be up to about 10 µm thick, usually in the 5-10 µm range. The indium and tin region may in certain embodiments be formed as two separate layers with a nominal weight ratio of 52 wt % indium, and 48 wt % tin, which means that layers of roughly equal thickness (for example, up to about 5 µm each) can be formed. When nickel and gold layers are used, in certain embodiments, they are each formed up to about 0.5 µm in thickness. Box 14 is positioning the surfaces so that the bumps, including the metal region on at least one of the surfaces to be joined, are brought into contact. Box 16 is heating the assembly, preferably in an atmosphere such as nitrogen, to bond the surfaces together. The use of the metal region enables the process to proceed without using a flux.

Figure 2:
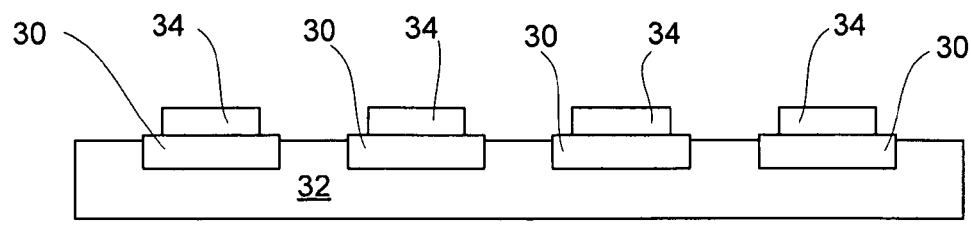
FIG. 2 illustrates an carrier holding substrates and chips positioned on the substrates, in accordance with certain embodiments.

FIG. 2-7 illustrate aspects of a fluxless bonding method for bonding a chip to a substrate in accordance with certain embodiments. As illustrated in FIG. 2, a plurality of substrates 30 are positioned in a suitable carrier 32 and a chip 34 is placed on each of the substrates 30. The substrates 30 and the chips 34 each include a plurality of bumps for making electrical connections therebetween. The bumps are not limited to the shapes illustrated in FIGS. 3-4, and may take a variety of shapes and sizes.

Figure 3:
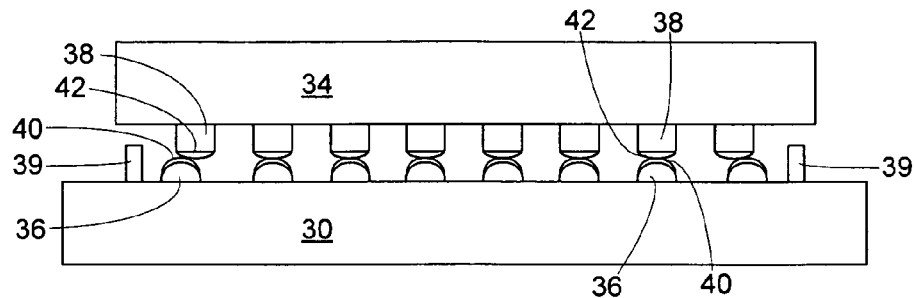
FIG. 3 illustrates a view of a substrate and chip positioned on the substrate, in accordance with certain embodiments.

As illustrated in FIG. 3, the substrate 30 includes bumps 36 thereon, and the chip 34 includes bumps 38 thereon. The substrate bumps 36 may in certain embodiments be formed from a suitable solder. Solders are typically formed from metals, (such as alloys including, but not limed to, tin/silver and lead/tin) and typically have a melting point of under 300 degrees Celsius. The chip bumps may be formed from metals, such as a solder, or a higher melting point metal having good electrical properties that can be bonded to other metals, including, but not limited to, copper and copper alloys. Thus, in certain embodiments, the substrate bumps are formed from a metal solder, such as a tin/silver eutectic composition, and the chip bumps are formed from a higher melting point metal such as copper or a copper alloy. Alternatively, the substrate bumps 36 could be formed from the higher melting point metal such as copper and the chip bumps 38 from a solder. In certain embodiments, at least one of the substrate bumps 36, and the chip bumps 38, is formed from a solder.

FIG. 3 illustrates the substrate bumps 36 including a region or layer 40 thereon, and the chip bumps 38 including a region or layer 42 thereon. The layers 40 and 42 may in certain embodiments include indium and tin, or include nickel and gold. The layers 40 and 42 may in certain embodiments include sub-layers. For example, if layer 40 and/or layer 42 is formed from indium and tin, the layer may be formed from a sub-layer of an indium and a sub-layer of tin, or, alternatively, the layer may be formed from a single layer of an indium/tin alloy. If one of the layer 40 or layer 42 is formed from nickel and gold, the layer will generally be formed from a sub-layer of gold and a sub-layer of nickel. Certain embodiments may also include a layer of indium and tin on one of the bumps 36, 38, and a layer of another material, including, but not limited to, metals such as gold, on the other of the bumps 36, 38.

Figure 4A:
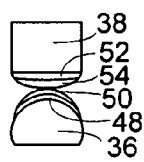
FIGS. 4(a)-(c) illustrate bump configurations in accordance with certain embodiments.
Figure 4B:
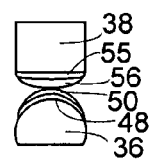
Figure 4C:
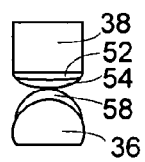

FIGS. 4(a)-4(c) illustrate the layout of the layers on the substrate bumps 36 and chip bumps 38, in accordance with certain embodiments, in greater detail. FIG. 4(a) illustrates the substrate bump 36 including two layers 48 and 50 thereon, and the chip bump 38 including two layers 52 and 54 thereon. The layers 48 and 50 may comprise individual layers of indium and tin. Similarly, the layers 52 and 54 may comprise individual layers of indium and tin.

FIG. 4(b) illustrates the substrate bump 36 including two layers 48 and 50 thereon, and the chip bump having two layers 55 and 56 thereon. The layers 48 and 50 may comprise individual layers of indium and tin. The layers 55 and 56 may comprise individual layers of nickel and gold. FIG. 4(c) illustrates the chip bump 38 including two layers 52 and 54 thereon, and the substrate bump having one layer 58 thereon. The layers 52 and 54 may, as noted above, may comprise individual layers of indium and tin. The layer 58 may comprise a layer of gold.

The use of layer 40 and 42 between the substrate bumps 36 and the chip bumps 38 allows for the bonding of the bumps without using a flux. This is believed to be due to ability of the layer to both protect the underlying surface from oxidation and wet the adjoining layer so a good bond can be achieved. For example, when the layers 40, 42 are formed from indium and tin, the application of a relatively small amount of pressure, at an elevated temperature, can break through an indium tin oxide. Once the oxide film is broken down, good wetting can take place in the absence of a flux. For example, if the substrate bump 36 comprises a tin-silver solder, the layers 40 and 42 comprise indium and tin, and the bump 38 comprises copper, then upon the application of a small amount of force and the presence of heat, an oxide layer on the indium tin layers 40, 42 can be broken and the layers may interact to form a good joint. Depending on the elements used for the bumps 36, 38 and the layers 40, 42, the finished joint may include a number of layers, including various combinations of the elements used. Some of the combinations may comprise intermetallic compounds. In one example, where the bumps 36 comprise tin-silver, the layers 40 and 42 comprise indium and tin, and the bump 38 comprises copper, the finished joint will include a copper region, and a number of other regions including various combinations of the elements. Some of the combinations, including, but not limited to those with indium and tin, may comprise intermetallic compounds.

As seen in FIG. 3, a number of the bumps may in certain embodiments be offset from one another, in order to hold the chip in the proper position on the substrate. More specifically, the outermost package bumps 36 are spaced further apart from adjacent bumps and as a result, when the chip bumps 38 are brought towards the package bumps 36, the outermost bumps are offset so that the bumps 36 and 38 (having the layers 40 and 42 thereon) contact each other off center, which will tend to keep the chip 34 from sliding and hold the bumps 36, 38 in place. Bumps other than the outermost package bumps may also be offset, and obtain a similar effect.

Figure 5:
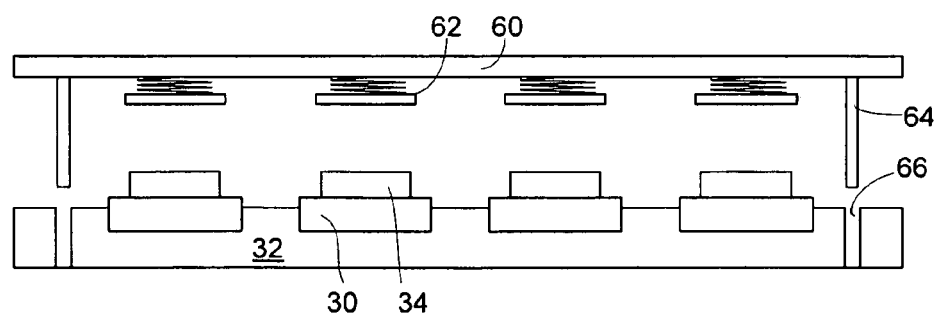
FIG. 5 illustrates an apparatus including a plate and spring loaded pedestals positioned over a carrier holding substrates and chips positioned on the substrates, in accordance with certain embodiments.

FIG. 5 illustrates an apparatus used for applying a force to the chip 34 positioned on the substrate 30. The apparatus includes a plate 60 having a plurality of spring loaded pedestals 62 extending therefrom. The spring loaded pedestals 62 are designed to apply a uniform compressive stress on the substrate 30 and chip 34 assembly. Alignment pins 64 also extend from the plate 60 and are adapted to fit into openings 66 in the carrier 32 holding the substrate 30 and chip 34 assembly.

Figure 6:
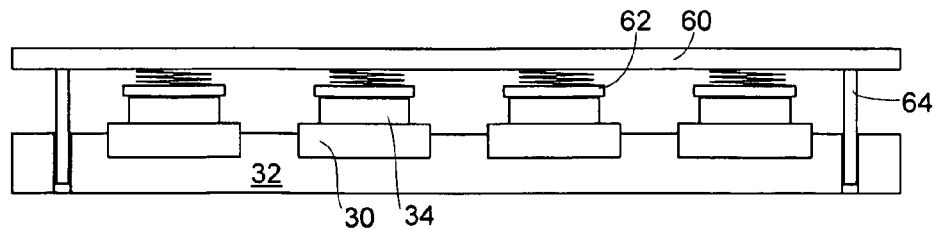
FIG. 6 illustrates the assembly of FIG. 4, with the spring loaded pedestals in contact with the chips, in accordance with certain embodiments.

FIG. 6 illustrates the apparatus with the spring loaded pedestals 62 in contact with the chips 34. The applied force may in certain embodiments be up to about 100 psi (pounds per square inch). The apparatus may then be heated in a furnace having an atmosphere that is substantially oxygen free, for example, an oxygen content no greater than 10 ppm. In certain embodiments a nitrogen atmosphere is used, and the substrate 30 and chip 34 assembly is heated to a temperature sufficient to melt (reflow) the solder used in at least one of the substrate bumps 36 and the chip bumps 38. One or more stops or spacers 39 (FIG. 3) may also be formed on the substrate 30 or chip 34 in order to provide a stop to prevent the chip from moving too close to the substrate after the solder melts. Such a spacer 39 may have a variety of shapes and may be formed from a material including, but not limited to, a polymer having a higher melting point that will be used for the melting of the solder. In certain embodiments, the temperature is brought to approximately 10-15 degrees Celsius greater than the melting point of the solder, for a suitable time period of up to about 2-3 minutes, or longer if necessary. The combination of the pressure and the temperature results in a good bond being formed between the substrate 30 and the chip 34. The plate 60 may then be lifted and the spring loaded pedestals 62 removed from the chip 34.

Figure 7:
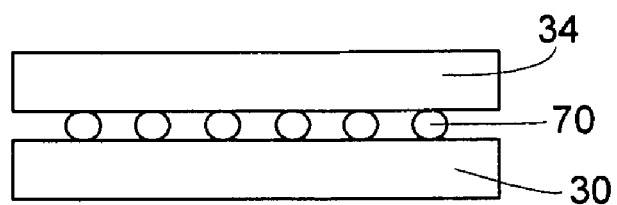
FIG. 7 illustrates a chip and substrate assembly formed in accordance with certain embodiments.

After cooling, the resultant assembly may appear as illustrated in the embodiment shown in FIG. 7, which shows the substrate 30 and the chip 34 coupled together through the regions 70, which include the materials of the substrate bumps 36, the chip bumps 38, and the metal layers 40 and 42. One or more intermetallic compounds may be present in the region 70, for example, an intermetallic phase comprising a plurality of materials including indium. If the chip bumps are formed from a relatively high melting point metal, the such bumps will remain in substantially their original form. In addition, one or more of the various metals present may react with the solder and form different alloys within the region 70.

Figure 8:
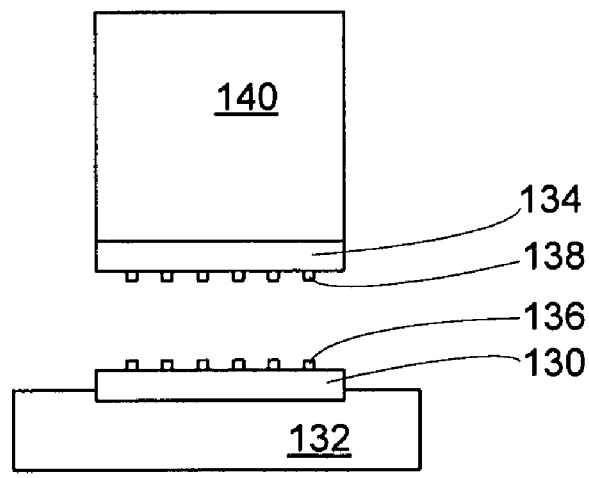
FIG. 8 illustrates an apparatus including a vacuum nozzle having a chip positioned thereon and a pedestal having a substrate positioned thereon, in accordance with certain embodiments.
Figure 9:
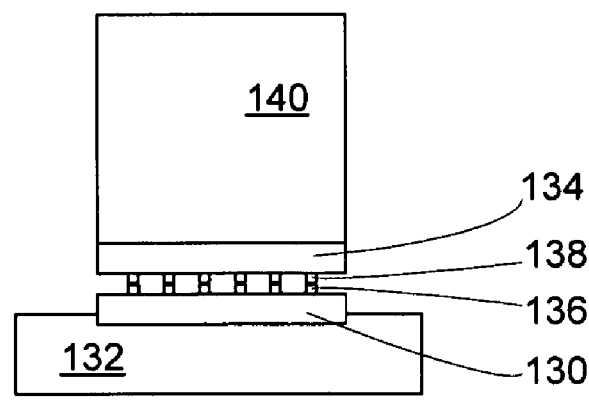
FIG. 9 illustrates the apparatus of FIG. 8, with the vacuum nozzle applying a force to the chip, in accordance with certain embodiments.
Figure 10:
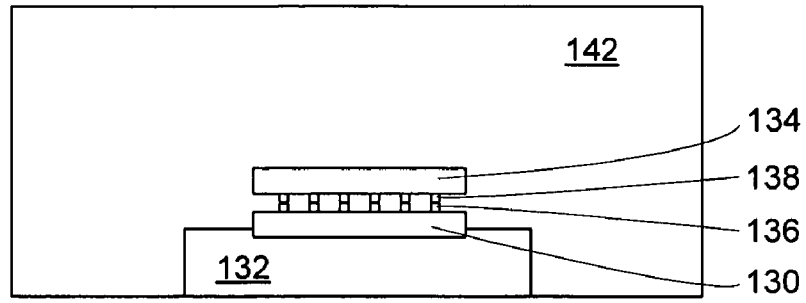
FIG. 10 the illustrates the chip and substrate of FIG. 9 positioned in an atmosphere controlled oven, in accordance with certain embodiments.

FIGS. 8-10 illustrate aspects of a another fluxless bonding method for bonding a chip to a substrate in accordance with certain embodiments. FIG. 8 illustrates an apparatus including a vacuum nozzle 140 and a pedestal 132. The vacuum nozzle 140 and pedestal 132 may both include heating elements and may be part of a TCB (thermal compression bonder) apparatus. As shown in FIG. 8, the vacuum nozzle 140 is holding a die or chip 134 and the pedestal 132 is holding the substrate 130. The substrate includes bumps 136 and the chip includes bumps 138. Similar to the description above for the bumps 36 and 38, the bumps 136 and 138 may include a metal region (such as the regions 40 and 42 described above) including indium and tin. In certain embodiments the indium and tin are formed on both of the groups of bumps 136, 138. In other embodiments, one group of the bumps 136, 138 may include the layer of indium and tin, and another of the bumps 136, 138 may include layers of nickel and gold, or just gold, thereon. When using the fixtures illustrated in FIG. 8, a variety of bump layouts may be used. For example, a layout such as that illustrated in FIG. 3, with the outermost bumps on the substrate being offset, may be used. Other layouts may also be used, including layouts in which the bumps on the substrate 130 and the chip 134 are not offset from one another, as illustrated in FIGS. 8 and 9. In certain embodiments, some of the bumps 136, 138, on either or both of the substrate 130 and chip 134, may be formed from a lower melting point solder than other bumps, and/or may be formed to be slightly larger than the other bumps. This permits these bumps to be more easily tacked together to hold the chip to the substrate prior to the higher temperature treatment.

FIG. 9 illustrates the chip 134 being brought into position with the substrate 130 though the bumps. The pedestal 132 and the vacuum nozzle 140 may be heated be heated to a temperature sufficient to permit at least some of the bumps 136, 138 to tack together. This may be accomplished at a temperature that is close to, but lower than, the melting point of at least some of the metal on the bumps 136, 138. The elevated temperature promotes a solid state diffusion that acts to tack the bumps together in the absence of a flux. Such elevated temperature tacking may in certain embodiments be carried out in a substantially oxygen free atmosphere such as nitrogen.

As illustrated in FIG. 10, after the bumps 136, 138 are tacked together, the vacuum nozzle 140 is removed from the chip 134 and the substrate 130 and chip 134 assembly is heated in a furnace to melt (reflow) the solder used in at least one of the substrate bumps 136 and the chip bumps 138. In certain embodiments, the furnace may be a continuous reflow oven and the heating may by conducted in a substantially oxygen free atmosphere (for example, nitrogen with no greater than 10 ppm oxygen) at a temperature of about 10-15 degrees Celsius greater than the melting point of the solder used in at least one of the groups of bumps 136, 138, for a suitable time period which may extend of up to about 2 to 3 minutes, or longer if necessary.

A variety of modifications to the embodiments described above are possible. For example, the tacking process described above in connection with FIGS. 8-10 may also be used with the embodiments described above in connection with FIGS. 2-7.

Figure 11:
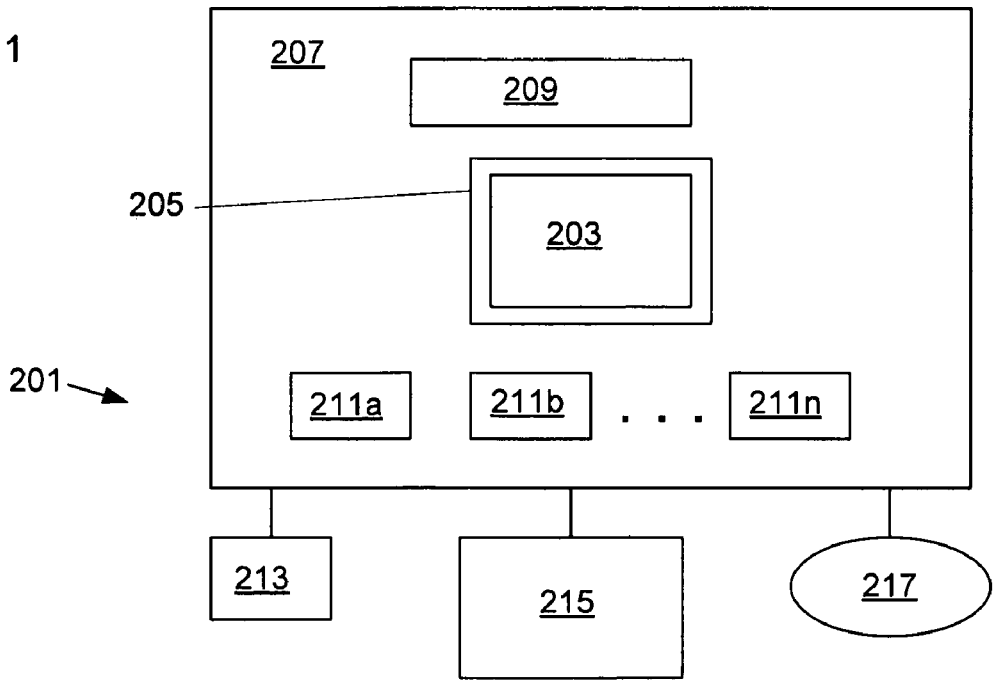
FIG. 11 illustrates an electronic system arrangement in which embodiments may find application.

Assemblies including a substrate and chip joined together as described in embodiment above may find application in a variety of electronic components. FIG. 11 schematically illustrates one example of an electronic system environment in which aspects of described embodiments may be embodied. Other embodiments need not include all of the features specified in FIG. 11, and may include alternative features not specified in FIG. 11.

The system 201 of FIG. 11 may include at least one central processing unit (CPU) 203. The CPU 203, also referred to as a microprocessor, may be a chip which is attached to an integrated circuit package substrate 205, which is then coupled to a printed circuit board 207, which in this embodiment, may be a motherboard. The CPU 203 on the package substrate 205 is an example of an electronic device assembly that may have a structure including indium and tin or nickel and gold in the bump area between the package and chip, in accordance with embodiments such as described above. A variety of other system components, including, but not limited to memory and other components discussed below, may also include chip and substrate structured formed in accordance with the embodiments described above.

The system 201 further may further include memory 209 and one or more controllers 211a, 211b . . . 211n, which are also disposed on the motherboard 207. The motherboard 207 may be a single layer or multi-layered board which has a plurality of conductive lines that provide communication between the circuits in the package 205 and other components mounted to the board 207. Alternatively, one or more of the CPU 203, memory 209 and controllers 211a, 211b . . . 211n may be disposed on other cards such as daughter cards or expansion cards. The CPU 203, memory 209 and controllers 211a, 211b . . . 211n may each be seated in individual sockets or may be connected directly to a printed circuit board. A display 215 may also be included.

Any suitable operating system and various applications execute on the CPU 203 and reside in the memory 209. The content residing in memory 209 may be cached in accordance with known caching techniques. Programs and data in memory 209 may be swapped into storage 213 as part of memory management operations. The system 201 may comprise any suitable computing device, including, but not limited to, a mainframe, server, personal computer, workstation, laptop, handheld computer, handheld gaming device, handheld entertainment device (for example, MP3 (moving picture experts group layer-3 audio) player), PDA (personal digital assistant) telephony device (wireless or wired), network appliance, virtualization device, storage controller, network controller, router, etc.

The controllers 211a, 211b . . . 211n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 213 in accordance with a storage protocol layer. The storage protocol of the layer may be any of a number of known storage protocols. Data being written to or read from the storage 213 may be cached in accordance with known caching techniques. A network controller can include one or more protocol layers to send and receive network packets to and from remote devices over a network 217. The network 217 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A method comprising:
providing a plurality of first metal bumps on a first surface;
providing a plurality of second metal bumps on a second surface;
wherein at least one of (i) the plurality of first metal bumps, and (ii) the plurality of second metal bumps, comprises a solder;
forming a metal region including indium and tin, on at least one of (i) the plurality of first metal bumps, and (ii) the plurality of second metal bumps;
positioning the first metal bumps on the second metal bumps; and
heating the metal bumps and the metal region and melting the solder, in the absence of a flux.

2. The method of claim 1, further comprising forming the metal region on the first metal bumps and on the second metal bumps.

3. The method of claim 1, wherein the first surface comprises a surface of a semiconductor chip and the second surface comprises a surface of a substrate, wherein the first metal bumps comprise copper and the second metal bumps comprise a solder; and wherein the heating the metal bumps and the metal region and melting the solder is carried out in the absence of a flux.

4. The method of claim 3, further comprising, forming the metal region on the second metal bumps; and forming a layer of nickel and a layer of gold on the first metal bumps.

5. The method of claim 3, further comprising forming the metal region on the first metal bumps and on the second metal bumps.

6. The method of claim 3, further comprising, forming the metal region on the first metal bumps; and forming a layer of gold on the second metal bumps.

7. The method of claim 1, further comprising forming the metal region on one of the first metal bumps and on the second metal bumps.

8. The method of claim 1, wherein forming the metal region includes forming a layer of indium and a layer of tin.

9. The method of claim 1, wherein forming the metal region includes forming a layer of an alloy of indium and tin.

10. The method of claim 1, further comprising positioning the second surface on a carrier prior to the bringing the first metal bumps into contact with the second metal bumps, and positioning the first bumps and the second bumps so that when positioned to face one another, a first plurality of the first metal bumps are offset from a first plurality of the second metal bumps, and a second plurality of the first metal bumps are aligned with a second plurality of the second metal bumps, and wherein a portion of each of the bumps from the first plurality of the first metal bumps that is offset from the first plurality of the second metal bumps is positioned to the side of the corresponding bump from the first plurality of the second metal bumps, so that the portion is not covered by the corresponding bump when viewed from above.

11. The method of claim 10, wherein the first plurality of first metal bumps and are positioned adjacent to an outer edge of the first surface.

12. The method of claim 1, wherein the heating comprises heating in an atmosphere having an oxygen content that is no greater than 10 ppm.

13. The method of claim 1, wherein only one of (i) the plurality of first metal bumps, and (ii) the plurality of second metal bumps, comprises a solder.

14. The method of claim 13, wherein the first metal bumps comprise copper, and the second metal bumps comprise a solder.

15. A method comprising: providing a plurality of first metal bumps on a first surface;
providing a plurality of second metal bumps on a second surface;
wherein at least one of (i) the plurality of first metal bumps, and (ii) the plurality of second metal bumps, comprises a solder;
forming a metal region including indium and tin, on at least one of (i) the plurality of first metal bumps, and (ii) the plurality of second metal bumps;
positioning the first metal bumps on the second metal bumps; and
heating the metal bumps and the region and melting the solder;
wherein the first surface comprises a surface of a semiconductor chip and the second surface comprises a surface of a substrate;
wherein the positioning the first metal bumps on the second metal bumps includes coupling one of the semiconductor chip and the substrate to a pedestal, coupling the other of the semiconductor chip and the substrate to a vacuum nozzle, and moving at least one of the nozzle and the pedestal to position a plurality of the first metal bumps on the second metal bumps through the metal region, wherein the platen and the vacuum nozzle are heated to a temperature that is less than the melting temperature of the metal region, and applying pressure to tack the bumps together through the metal region; and
wherein the heating the metal bumps and the metal region comprises transporting the semiconductor chip and substrate having bumps that are tacked together to a continuous reflow oven having an oxygen content that is less than 10 ppm, and heating the oven to a temperature sufficient to form a bond and melt the solder.

16. A method comprising:
providing a plurality of substrates including first metal bumps thereon;
providing a plurality of semiconductor chips including second bumps thereon;
wherein at least one of the (i) plurality of first metal bumps, and (ii) plurality of second metal bumps, comprises a solder;
applying indium and tin on the metal bumps on at least one of (i) the plurality of substrates, and (ii) the plurality of semiconductor chips;
placing the chips on the substrates so that the second metal bumps are on the first metal bumps;
applying a force to the plurality of chips on the substrates; and
heating the first metal bumps and the second metal bumps and the layer of material, to melt the solder and to form bonds between the chips and the substrates, in the absence of a flux.

17. The method of claim 16, wherein the applying indium and tin comprises applying the indium and tin on the first metal bumps and on the second metal bumps.

18. The method of claim 16, wherein the applying indium and tin comprises applying the indium and tin on the first metal bumps and not to the second metal bumps, and wherein a layer of gold is applied on the second metal bumps.

19. The method of claim 16, wherein the applying a force comprises positioning a plate having a plurality of spring loaded pedestals so that the pedestals contact the chips and apply a force thereto.

20. The method of claim 16, wherein the plurality of first metal bumps are formed from a material comprising a solder;

and wherein the heating the first metal bumps and the second metal bumps and the layer of material is carried out in the absence of a flux.

21. The method of claim 16, wherein the placing the chips on the substrates includes coupling one of the plurality of semiconductor chips and the plurality of substrates to a pedestal, coupling the other of the plurality of semiconductor chips and the plurality of substrates to a vacuum nozzle, and moving at least one of the nozzle and the pedestal to position a plurality of the first metal bumps on the second metal bumps through the metal region, wherein the platen and the vacuum nozzle are heated to a temperature that is less than the melting temperature of the metal region, and applying pressure to tack the bumps together through the metal region using solid state diffusion.

22. A method comprising:
providing a first metal bump on a first surface;
providing a second metal bump on a second surface;
wherein at least one of the first metal bump and the second metal bump comprises a solder;
forming a metal region including indium and tin, on the second metal bump;
positioning the first metal bump on the second metal bump; and
heating the metal bumps and the metal region and melting the solder, in the absence of a flux.

23. The method of claim 22, wherein the metal region includes a first layer comprising indium and a second layer comprising tin formed on the first layer.

24. The method of claim 22, wherein the metal region includes an alloy layer comprising indium and tin.

25. The method of claim 22,
wherein the first surface comprises a surface of a semiconductor chip and the second surface comprises a surface of a substrate;
wherein the positioning the first metal bump on the second metal bump includes coupling one of the semiconductor chip and the substrate to a pedestal, coupling the other of the semiconductor chip and the substrate to a vacuum nozzle, and moving at least one of the nozzle and the pedestal to position the first metal bump on the second metal bump through the metal region, wherein the platen and the vacuum nozzle are heated to a temperature that is less than the melting temperature of the metal region, and applying pressure to tack the bumps together through the metal region using solid state diffusion.

* * * * *